(12) United States Patent
Fan et al.

(10) Patent No.: US 8,405,081 B2
(45) Date of Patent: Mar. 26, 2013

(54) ORGANIC THIN FILM TRANSISTOR HAVING PERIPHERAL METAL STRUCTURES

(75) Inventors: Ching-Lin Fan, Keelung (TW); Yu-Zuo Lin, Hsinchu (TW); Chao-Hung Huang, New Taipei (TW)

(73) Assignee: National Taiwan University of Science and Technology, Taipei (TW)

( * ) Notice: Subject to any disclaimer, the term of this patent is extended or adjusted under 35 U.S.C. 154(b) by 18 days.

(21) Appl. No.: 13/076,507

(22) Filed: Mar. 31, 2011

(65) Prior Publication Data
US 2012/0138930 A1    Jun. 7, 2012

(30) Foreign Application Priority Data

Dec. 3, 2010   (TW) .............................. 99142182 A

(51) Int. Cl.
| | |
|---|---|
| H01L 29/04 | (2006.01) |
| H01L 29/10 | (2006.01) |
| H01L 31/036 | (2006.01) |
| H01L 31/0376 | (2006.01) |
| H01L 31/20 | (2006.01) |
| H01L 29/08 | (2006.01) |
| H01L 35/24 | (2006.01) |
| H01L 51/00 | (2006.01) |
| H01L 29/76 | (2006.01) |
| H01L 31/112 | (2006.01) |
| H01L 29/15 | (2006.01) |
| H01L 23/48 | (2006.01) |
| H01L 23/52 | (2006.01) |
| H01L 29/40 | (2006.01) |

(52) U.S. Cl. ................ 257/57; 257/40; 257/59; 257/66; 257/72; 257/759; 257/E29.117; 257/E29.137; 257/E29.151; 257/E29.202; 257/E29.273; 257/E51.005

(58) Field of Classification Search .................... 257/40, 257/759, E51.005, 57, 59, 66, 72, E29.117, 257/E29.137, E29.273, E29.151, E29.202
See application file for complete search history.

(56) References Cited

U.S. PATENT DOCUMENTS

| | | | | |
|---|---|---|---|---|
| 4,710,264 | A * | 12/1987 | Waschler et al. | 438/697 |
| 6,346,471 | B1 * | 2/2002 | Okushima | 438/622 |
| 6,686,633 | B1 * | 2/2004 | Lage et al. | 257/392 |
| 6,812,551 | B2 * | 11/2004 | Hawker et al. | 257/632 |
| 6,933,532 | B2 * | 8/2005 | Arnold et al. | 257/80 |
| 7,042,092 | B1 * | 5/2006 | Yegnashankaran et al. | 257/758 |
| 7,049,221 | B2 * | 5/2006 | Deguchi | 438/622 |
| 7,060,193 | B2 * | 6/2006 | Yelehanka et al. | 216/13 |
| 7,087,982 | B2 * | 8/2006 | Huang et al. | 257/642 |
| 7,309,958 | B2 * | 12/2007 | Kim et al. | 313/506 |
| 7,335,919 | B2 * | 2/2008 | Koo et al. | 257/72 |
| 7,554,113 | B2 * | 6/2009 | Arai et al. | 257/40 |
| 7,667,385 | B2 * | 2/2010 | Lee et al. | 313/504 |
| 7,714,324 | B2 * | 5/2010 | Suh et al. | 257/40 |
| 7,775,845 | B2 * | 8/2010 | Fukase et al. | 445/23 |
| 7,943,419 | B2 * | 5/2011 | Baldo et al. | 438/99 |

(Continued)

*Primary Examiner* — Ida M Soward
(74) *Attorney, Agent, or Firm* — Jianq Chyun IP Office

(57) ABSTRACT

An organic thin field transistor is disclosed. The organic thin field transistor includes a first and a second insulting layers, a metal structure and an organic layer serving as an active layer. Materials of the first and the second insulting layers are different, and by performing an etching process, a surface of the metal structure and a surface of the second insulating layer are effectively aligned. Because of the high flatness of the surface of the metal structure and the second insulating layer, a continuous film-forming property and crystallinity of the active layer of the organic thin field transistor are improved, so as to achieve a better the electrical characteristic.

2 Claims, 6 Drawing Sheets

U.S. PATENT DOCUMENTS

| | | | |
|---|---|---|---|
| 7,978,399 B2 * | 7/2011 | Yamazaki et al. | 359/296 |
| 8,022,396 B2 * | 9/2011 | Yamamoto | 257/40 |
| 8,110,825 B2 * | 2/2012 | Obata et al. | 257/40 |
| 8,258,514 B2 * | 9/2012 | Nomoto et al. | 257/59 |
| 2007/0290604 A1 * | 12/2007 | Sakanoue et al. | 313/503 |
| 2008/0149922 A1 * | 6/2008 | Lin et al. | 257/40 |
| 2011/0013256 A1 * | 1/2011 | Uchiyama et al. | 359/290 |
| 2011/0101326 A1 * | 5/2011 | Nagamatsu et al. | 257/40 |

* cited by examiner

ORGANIC THIN FILM TRANSISTOR HAVING PERIPHERAL METAL STRUCTURES

CROSS-REFERENCE TO RELATED APPLICATION

This application claims the priority benefit of Taiwan application serial no. 99142182, filed on Dec. 3, 2010. The entirety of the above-mentioned patent application is hereby incorporated by reference herein and made a part of this specification.

BACKGROUND

1. Field of the Invention

The invention relates to an organic thin film transistor structure and a fabrication method thereof. Particularly, the invention relates to a bottom contact organic thin film transistor structure and a fabrication method thereof.

2. Description of Related Art

In a conventional technique domain, organic thin film transistors are divided into two types according to structures thereof, which are top contact organic thin film transistors and bottom contact organic thin film transistors.

Referring to FIG. 1, FIG. 1A is a cross-sectional view of a conventional top contact organic thin film transistor 110. When the top contact organic thin film transistor 110 is fabricated, deposition of an organic layer serving as an active layer 113 is first performed, and then deposition of a source 111 and a drain 112 is performed. Generally, an organic semiconductor material of the active layer 113 is sensitive to moisture and oxygen in atmosphere and solvent. Moreover, a chemical solvent (for example, a developer) used in a photolithography process may cause certain damage to the organic material, so that the photolithography process cannot be used to pattern the deposited source 111 and drain 112. Instead, a metal mask is used to achieve a partial deposition effect. However, a device size of the organic thin film transistor 110 fabricated according to the above method is limited to a gap size of the metal mask, which is of no avail for integration and mass production of the organic thin film transistors.

Referring to FIG. 1B, FIG. 1B is a cross-sectional view of a conventional bottom contact organic thin film transistor 120. When the bottom contact organic thin film transistor 120 is fabricated, deposition of an active layer 121 is performed last, so that a source 122 and a drain 123 can be fabricated through a general photolithography process. Compared to the aforementioned top contact organic thin film transistor 110, the bottom contact organic thin film transistor 120 is adapted to be used in small size devices. However, in the bottom contact organic thin film transistor 120, flatness of a contact surface between the active layer 121 and the source 122 and the drain 123 serving as electrodes is poor, so that an electrical characteristic of the bottom contact organic thin film transistor 120 is inferior to that of the top contact organic thin film transistor.

SUMMARY OF THE INVENTION

The invention is directed to an organic thin film transistor, which has a property of high flatness.

The invention provides a fabrication method of an organic thin film transistor, which is used to fabricate the organic thin film transistor having a property of high flatness.

The invention provides an organic thin film transistor including a substrate, a first insulating layer, a second insulting layer, a metal structure and an organic layer. The first insulating layer covers the substrate, the second insulating layer partially covers the first insulating layer, and materials of the first insulating layer and the second insulating layer are different. The metal structure is disposed at periphery of the second insulating layer, and covers a part of the first insulating layer that is not covered by the second insulating layer, where a surface of the metal structure is aligned to a surface of the second insulating layer. The organic layer covers the second insulating layer and the metal structure.

In an embodiment of the invention, etching selectivity ratios of the first insulating layer and the second insulating layer relative to an etching solution are different.

In an embodiment of the invention, a material of the first insulating layer is silicon nitrixide.

In an embodiment of the invention, a material of the second insulating layer is silicon dioxide.

The invention provides a fabrication method of an organic thin film transistor, which includes following steps. A substrate is first provided, and then a first insulating layer is formed to cover the substrate. Then, a second insulating layer is formed to cover the first insulating layer, and a patterned photoresist layer is formed to partially cover the second insulating layer. Then, a part of the second insulating layer that is not covered by the patterned photoresist layer is removed by using an etching method to faun an exposed part. A metal layer is formed to cover the exposed part and the patterned photoresist layer. The patterned photoresist layer and the metal layer covering the patterned photoresist layer are removed. Finally, an organic layer is formed to cover the second insulating layer and the metal layer.

In an embodiment of the invention, the etching method is wet etching.

In an embodiment of the invention, etching selectivity ratios of the first insulating layer and the second insulating layer relative to an etching solution are different.

In an embodiment of the invention, the etching method is dry etching.

In an embodiment of the invention, the step of removing the patterned photoresist layer and the metal layer covering the patterned photoresist layer includes removing the patterned photoresist layer by using a lift-off method, so as to remove the metal layer covering the patterned photoresist layer.

In an embodiment of the invention, the metal layer is formed through physical vapor deposition.

In an embodiment of the invention, the physical vapor deposition includes thermal evaporation, sputtering or electron beam vacuum evaporation.

According to the above descriptions, the first insulting layer and the second insulating layer with different materials are used to prevent an over etching phenomenon or an unevenness phenomenon during the etching process. Therefore, the organic thin film transistor of the invention may have a property of high flatness, and have a good electrical characteristic.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1A:
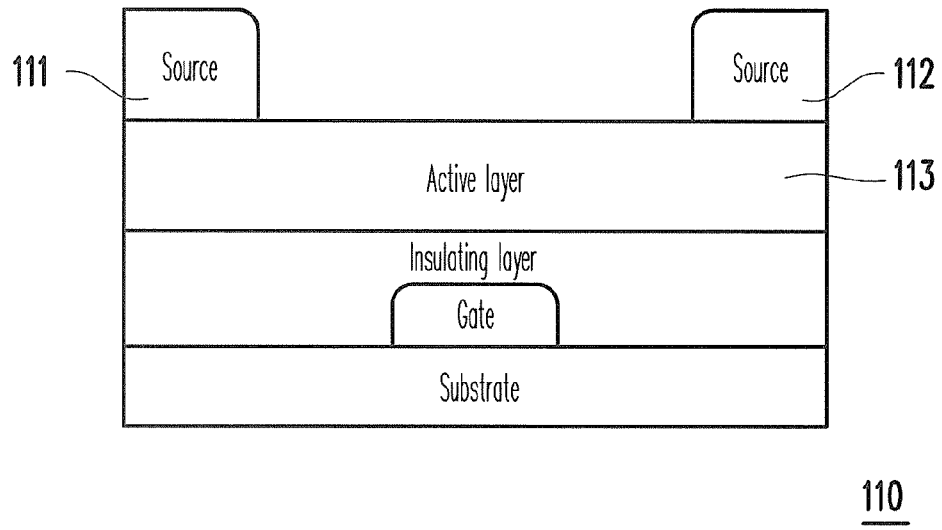
FIG. 1A is a cross-sectional view of a conventional top contact organic thin film transistor 110.
Figure 1B:
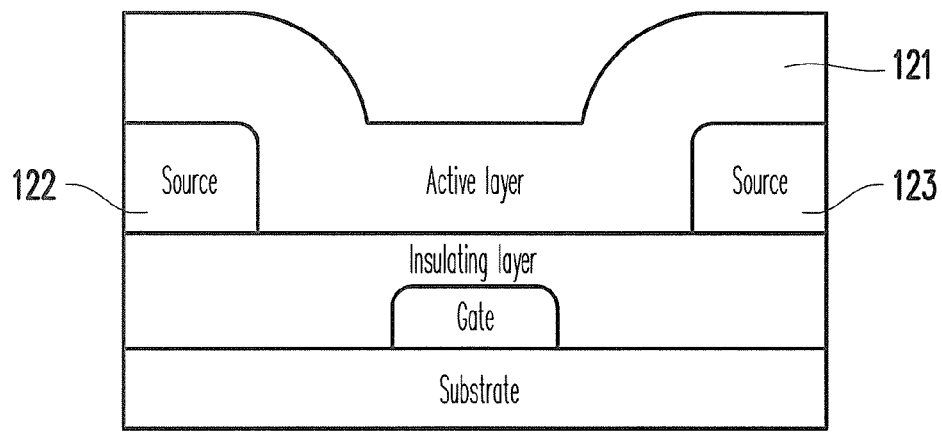
FIG. 1B is a cross-sectional view of a conventional bottom contact organic thin film transistor 120.
Figure 2:
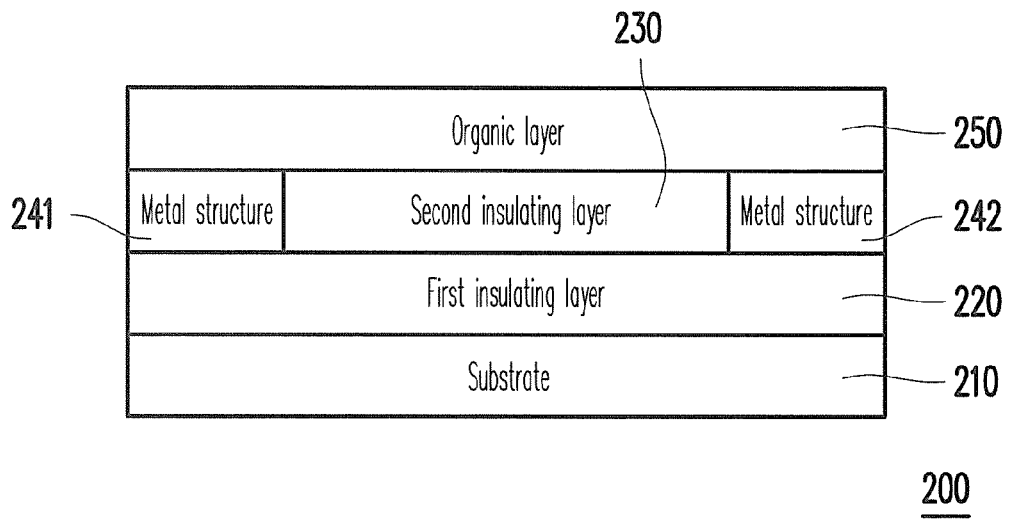
FIG. 2 is a cross-sectional view of an organic thin film transistor 200 according to an embodiment of the invention.

Referring to FIG. 2, FIG. 2 is a cross-sectional view of an organic thin film transistor 200 according to an embodiment of the invention. The organic thin film transistor 200 includes a substrate 210, a first insulating layer 220, a second insulting layer 230, metal structures 241 and 242 and an organic layer 250. The substrate 210 is a substrate of a silicon wafer. In the present embodiment, the substrate 210 is a N-type heavy doping silicon wafer substrate. Moreover, the first insulating layer 220 covers the substrate 210, the second insulating layer 230 partially covers the first insulating layer 220, and materials of the first insulating layer 220 and the second insulating layer 230 are different. The first insulating layer 220 and the second insulating layer 230 are formed by well-developed inorganic materials with stable physical and chemical properties. In the present embodiment, the first insulating layer 220 can be formed by silicon nitride ($Si_3N_4$), and the second insulating layer can be formed by silicon dioxide ($SiO_2$).

It should be noticed that the materials of the first insulating layer 220 and the second insulating layer 230 can be selected according to etching selectivity ratios of different materials relative to a same etching solution. For example, the materials that ensure an etching rate of the second insulating layer 230 during wet etching to be obviously higher than an etching rate of the first insulating layer 220 during the wet etching can be selected. In this way, an etching degree of the second insulating layer 230 can be simply and clearly determined, so as to prevent over etching or inadequate etching. In other embodiments, the first insulating layer 220 and the second insulating layer 230 can be respectively formed by one of silicon nitride ($Si_3N_4$) and aluminium oxide ($Al_2O_3$), silicon nitride ($Si_3N_4$) and high purity hafnium oxide ($HfO_2$) or silicon nitride ($Si_3N_4$) and silicon oxide ($SiO_2$), and polymer. Moreover, the first insulating layer 220 and the second insulating layer 230 can be exchanged.

The metal structures 241 and 242 are disposed at periphery of the second insulating layer 230, and cover a part of the first insulating layer 220 that is not covered by the second insulating layer 230, where surfaces of the metal structures 241 and 242 are aligned to a surface of the second insulating layer 230. Namely, a contact surface formed between the second insulating layer 230, the metal structures 241 and 242 and the organic layer 250 is flat. Moreover, the metal structures 241 and 242 are respectively used for constructing a source (or a drain) and the drain (or the source) of the organic thin film transistor 200.

The organic layer 250 covers the second insulating layer 230 and the metal structures 241 and 242. The organic layer 250 is formed by an organic material, which serves as an active layer of the organic thin film transistor 200.

Another embodiment is provided below to describe a fabrication method of the organic thin film transistor provided by the invention for those skilled in the art.

Figure 3:
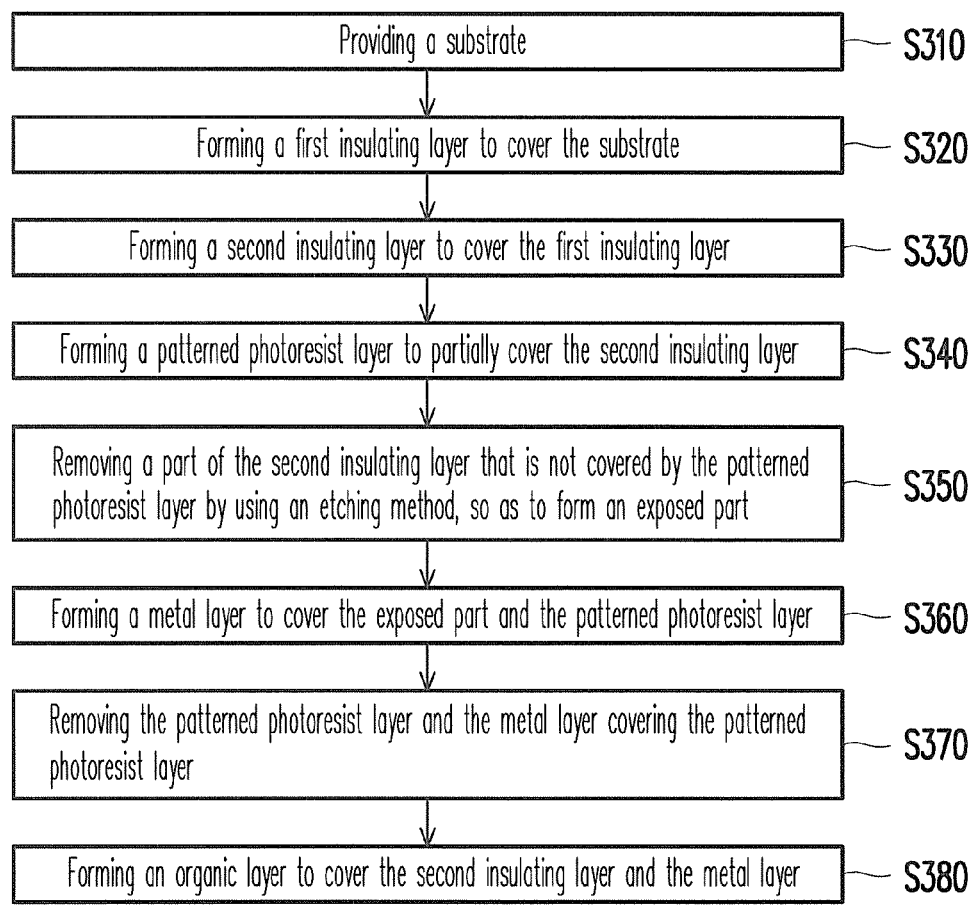
FIG. 3 and FIGS. 4A-4E are respectively a flowchart of a fabrication method of an organic thin film transistor and structural schematic diagrams corresponding to the fabrication steps.
Figure 4A:
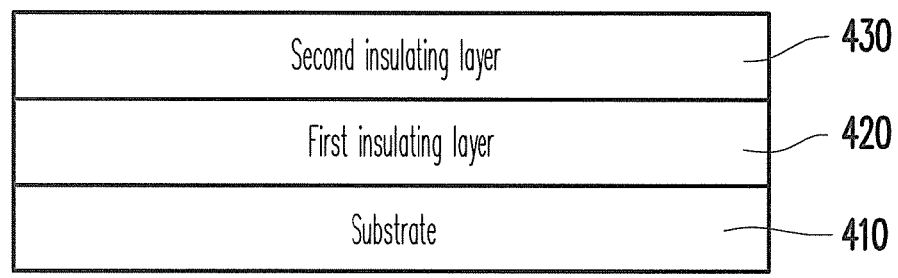

Referring to FIG. 3 and FIGS. 4A-4E, FIG. 3 and FIGS. 4A-4E are respectively a flowchart of a fabrication method of an organic thin film transistor and structural schematic diagrams corresponding to the fabrication steps. Referring to FIG. 3 and FIG. 4A, in the fabrication method of the organic thin film transistor, first, a substrate 410 is provided (S310), and a first insulating layer 420 is formed on the substrate 410 to cover the substrate 410 (S320). Then, a second insulating layer 430 is formed on the first insulating layer 420 to cover the first insulating layer 420 (S330).

The substrate 410 is a N-type heavy doping silicon wafer substrate, and the first and the second insulating layers 420 and 430 can be developed by using a high temperature tube furnace according to a low pressure chemical vapor deposition method with a better film-forming property. Besides the thin film deposited by using the high temperature tube furnace has a better film-forming property, evenness of film thickness thereof is higher than that obtained by using a general chemical vapor deposition with a low temperature and fast deposition speed, so that a process demand for thickness accuracy is satisfied.

Figure 4B:
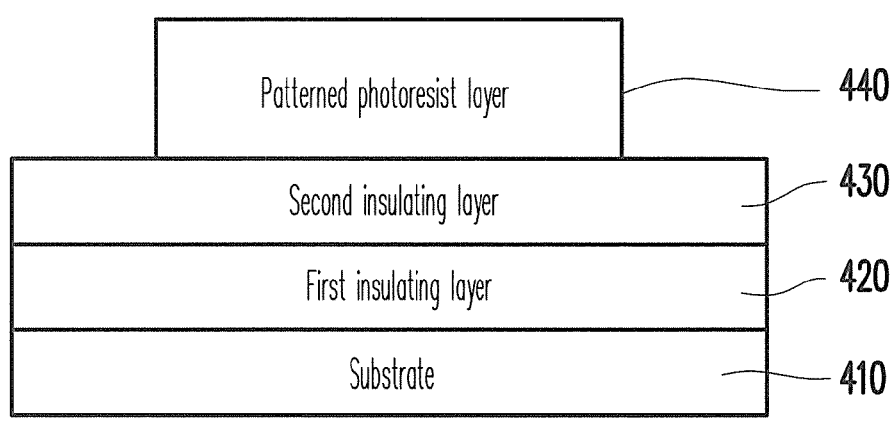

Then, referring to FIG. 3 and FIG. 4B, after the second insulating layer 430 is formed, a patterned photoresist layer 440 is formed to partially cover the second insulating layer 430 (S340).

Figure 4C:
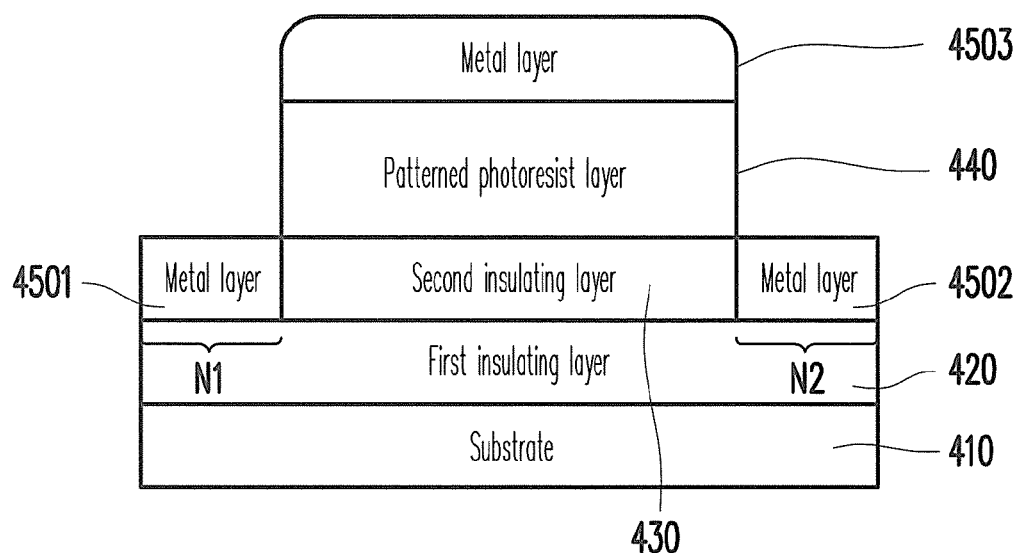

Then, referring to FIG. 3 and FIG. 4C, after the step S340 is completed, a part of the second insulating layer 430 that is not covered by the patterned photoresist layer 440 is removed by using an etching method to form exposed parts N1 and N2 (S350). Meanwhile, a metal layer 450 is formed to cover the exposed parts N1 and N2 and the patterned photoresist layer 440 (step S360).

The aforementioned etching method can be dry etching or wet etching. When the dry etching is used, an endpoint of the etching process can be detected to determine whether the etching process is completed. In detail, assuming the first insulating layer 420 is formed by silicon nitride and the second insulating layer 430 is formed by silicon dioxide, during the dry etching process, it is detected whether an etched substance contains nitride, so as to determine whether the etching process is completed. If the etched substance contains nitride, it represents that the etching process is completed. Comparatively, if the etched substance does not contain nitride, it represents that the etching process is still not completed.

If the wet etching is used to implement the step S350, materials with different etching selectivity ratios can be used to construct the first insulating layer 420 and the second insulating layer 430. Again, assuming the first insulating layer 420 is formed by silicon nitride and the second insulating layer 430 is formed by silicon dioxide, since an etching speed of the second insulating layer 430 (silicon oxide) in a buffer oxidation etchant (BOE) during the wet etching process is faster than an etching speed of the first insulating layer 420 during the wet etching process, the over etching phenomenon can be effectively avoided.

Then, referring to FIG. 3 and FIG. 4C, after the step S350 is completed, metal layers 4501, 4502 and 4503 are formed to cover the exposed parts N1 and N2 and the patterned photoresist layer 440 (S360). The metal layer 450 can be formed through physical vapor deposition, and the physical vapor deposition includes thermal evaporation, sputtering or electron beam vacuum evaporation, which is known by those skilled in the art, so that detailed descriptions thereof are not repeated.

Figure 4D:
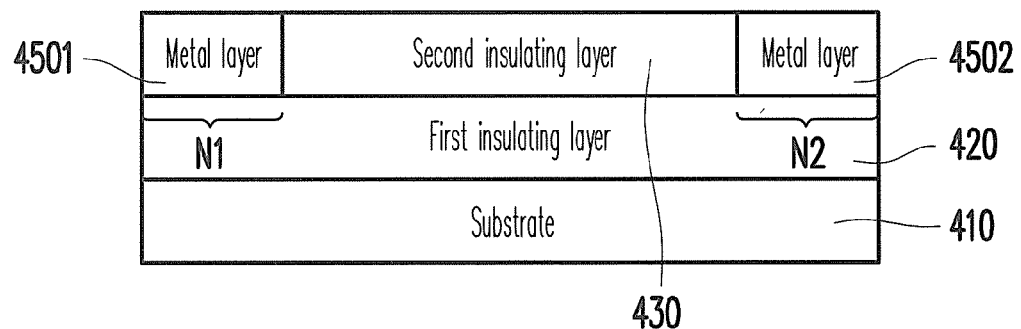

Then, referring to FIG. 3 and FIG. 4D, after the step S360 is completed, the patterned photoresist layer 440 and the metal layer 4503 covering the patterned photoresist layer 440 are removed (S370). It should be noticed that a lift-off method can be used to remove the patterned photoresist layer 440. According to the lift-off method, a chip (or a wafer) obtained after the step S360 can be simply disposed in an acetone solution for ultrasonic vibration treatment, and then ionised water is used to wash the acetone solution remained on the chip (or wafer).

Therefore, it is known that after the patterned photoresist layer 440 and the metal layer 4503 are lifted off, upper surfaces of the metal layers 4501 and 4502 and the second insulating layer 430 may form a flat contact surface.

Figure 4E:
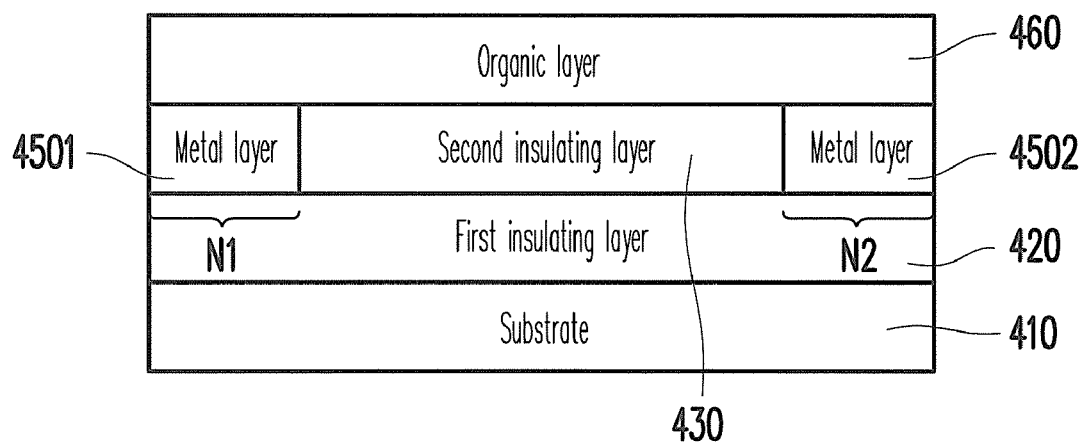

Finally, referring to FIG. 3 and FIG. 4E, after the step S370 is completed, an organic layer 460 serving as an active layer is formed to cover the second insulating layer 430 and the metal layers 4501 and 4502. By now, fabrication of the organic thin film transistor is completed.

Figure 5:
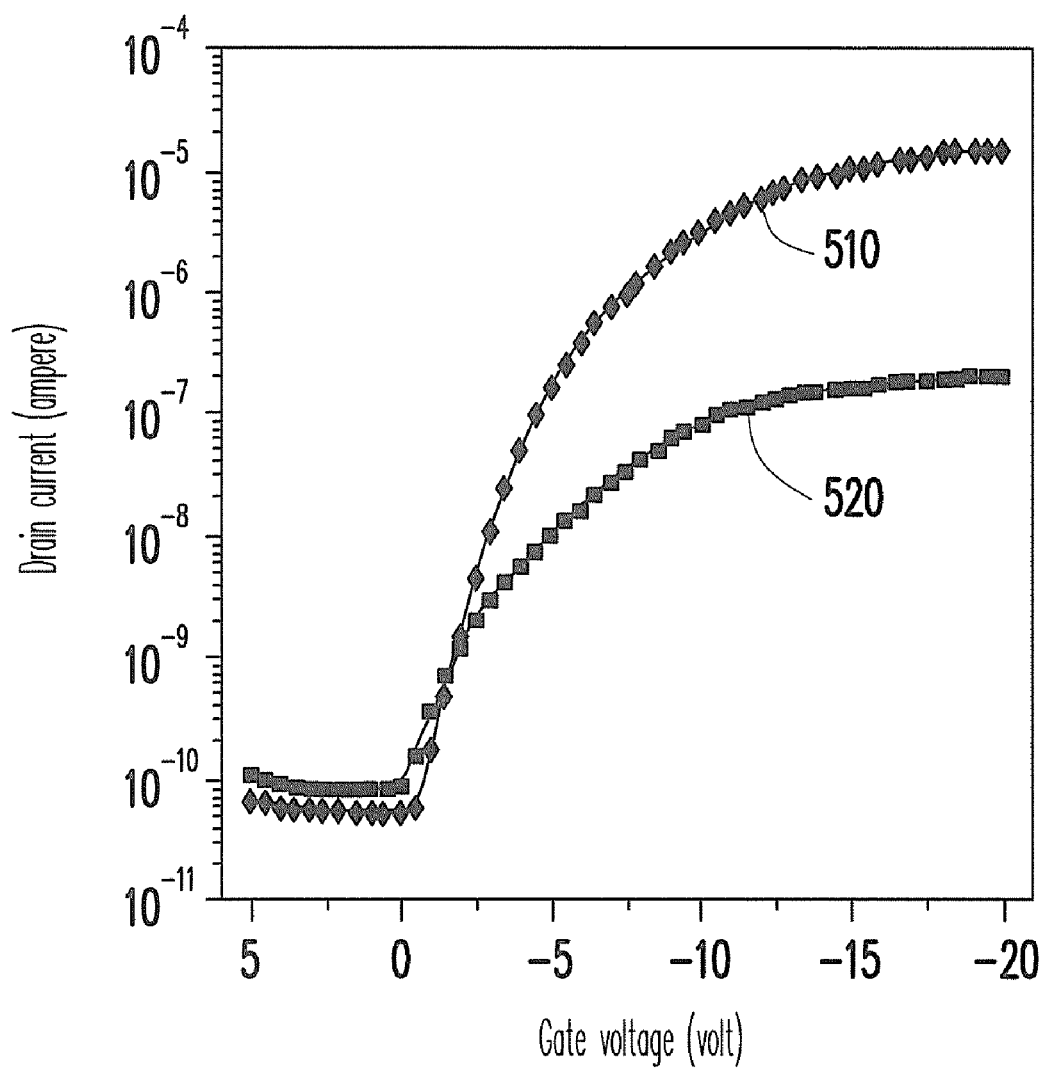
FIG. 5 is a comparison diagram of electrical characteristics of an organic thin film transistor of an embodiment of the invention and a conventional bottom contact organic thin film transistor.

Referring to FIG. 5, FIG. 5 is a comparison diagram of electrical characteristics of the organic thin film transistor of the present embodiment and a conventional bottom contact organic thin film transistor. FIG. 5 is a relationship diagram of gate voltages and drain currents measured in case that a voltage difference ($V_{DS}$) of the drain and the source of the organic thin film transistor is equal to −10 volts, in which a curve 510 is a characteristic curve of the organic thin film transistor of the present embodiment, and a curve 520 is a characteristic curve of the conventional bottom contact organic thin film transistor. Obviously, under a same gate voltage, the organic thin film transistor of the present embodiment may have a larger drain current.

In summary, in the invention, two insulting layers with different materials are used to accurately complete the etching process without causing an over etching or inadequate etching phenomenon. Therefore, the drain, the source (the metal structures) and the second insulating layer of the organic thin film transistor can form a flat contact surface for directly connecting the organic layer serving as the active layer, so that the organic thin film transistor having a good electrical characteristic is fabricated.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An thin film transistor, comprising:
a substrate;
a first insulating layer, covering the substrate;
a second insulating layer, partially covering the first insulating layer, wherein materials of the first insulating layer and the second insulating layer are different;
a metal structure, disposed at periphery of the second insulating layer, and covering a part of the first insulating layer that is not covered by the second insulating layer, wherein a surface of the metal structure is aligned to a surface of the second insulating layer; and
an organic semiconductor layer, covering the second insulating layer and the metal structure, wherein materials of the first insulating layer and the second insulating layer are both inorganic materials or both organic materials.

2. The organic thin film transistor as claimed in claim 1, wherein etching selectivity ratios of the first insulating layer and the second insulating layer relative to an etching solution are different.

* * * * *